United States Patent
Akimoto

[11] Patent Number: 6,043,500
[45] Date of Patent: Mar. 28, 2000

[54] EXPOSURE APPARATUS AND ITS CONTROL METHOD

[75] Inventor: Satoshi Akimoto, Utsunomiya, Japan

[73] Assignee: Canon Kabushiki Kaisha, Tokyo, Japan

[21] Appl. No.: 09/105,994

[22] Filed: Jun. 29, 1998

[30] Foreign Application Priority Data

Jul. 3, 1997 [JP] Japan ................................. 9-192034

[51] Int. Cl.[7] .................................................. G01B 11/00
[52] U.S. Cl. ........................... 250/548; 356/399; 356/395
[58] Field of Search ........................... 250/548, 559.3; 356/399, 400, 401, 375; 355/53, 55

[56] References Cited

U.S. PATENT DOCUMENTS

| 5,742,397 | 4/1998 | Kim | 250/548 |
|---|---|---|---|
| 5,955,739 | 9/1999 | Kawashima | 250/548 |

*Primary Examiner*—Edward P. Westin
*Assistant Examiner*—Kevin Pyo
*Attorney, Agent, or Firm*—Fitzpatrick, Cella, Harper & Scinto

[57] ABSTRACT

An exposure apparatus, which has a projection optical system, a Z-stage movable in the optical axis direction of the projection optical system, an X-Y stage movable in a planar direction perpendicular to the optical axis direction, and a sensor for measuring the positional relationship between a substrate placed on the Z-stage and a predetermined position in the optical axis direction and/or any tilt of the substrate, sequentially moves and aligns the X-Y stage to change the area to be exposed on the substrate, executes a measurement using the sensor, and exposes while correcting the positional relationship between the substrate and the predetermined position in the optical axis direction and/or any tilt of the substrate in accordance with the measurement result, has a control unit for adjusting the measurement start timing of the sensor in correspondence with a change in area to be exposed on the substrate.

22 Claims, 6 Drawing Sheets

EXPOSURE APPARATUS AND ITS CONTROL METHOD

BACKGROUND OF THE INVENTION

1. Field of the Invention

The present invention relates to an exposure apparatus and its control method and, more particularly, to an exposure apparatus which measures focus errors on a substrate such as a mask substrate, semiconductor wafer, and the like used in the manufacture of devices such as a semiconductor device, liquid crystal display device, and the like, and tilt errors on the substrate, and corrects these errors, and its control method.

2. Description of the Related Art

In a conventional apparatus of this type, in order to match the surface of a wafer with the imaging plane of a projection optical system, any focus and tilt errors of the wafer are measured by a focus & tilt sensor, and alignment is made using a stage that can adjust such focus and tilt errors. In this case, the focus and tilt errors are measured a predetermined period of time after an X-Y stage is driven in a direction perpendicular to the optical axis to start alignment, and the same timing is used for all the positions in the wafer plane.

As described above, since the measurement start timing of focus and tilt errors is the same for all the positions in the wafer plane, high adjustment precision of focus and tilt errors and short alignment time cannot both be achieved at the same time. If the measurement start timing is advanced to shorten the alignment time, measurements must be started before vibrations of the stage in the optical axis direction settle down, and focus and tilt errors cannot be accurately measured, thus impairing the adjustment precision. By contrast, if the measurement start timing is delayed until vibrations of the stage settle down so as to improve the adjustment precision, the alignment time is prolonged. Since vibrations of the stage differ depending on different positions in the wafer plane, optimal measurement timings should be determined depending on different positions in the wafer plane. However, since the same timing is used in the conventional apparatus, the measurement precision of focus and tilt errors suffers, or the alignment time is prolonged.

SUMMARY OF THE INVENTION

The present invention has been made in consideration of the conventional problems, and has as its object to improve productivity by shortening the alignment time without lowering adjustment precision of focus and tilt errors of the substrate surface.

According to one aspect of the present invention, an exposure apparatus which has a projection optical system, a stage which is movable in an optical axis direction of the projection optical system and a planar direction perpendicular to the optical axis direction, and a measurement device for measuring a positional relationship between a substrate placed on the stage and a predetermined position in the optical axis direction and/or a tilt of the substrate, sequentially moves and aligns the substrate to change an area to be exposed on the substrate, executes a measurement using the measurement device, and exposes while correcting the positional relationship between the substrate and the predetermined position in the optical axis direction and/or the tilt of the substrate in accordance with the measurement result, comprises: a control unit for adjusting a measurement start timing of the measurement device in correspondence with a change in area to be exposed on the substrate.

In the exposure apparatus, for example, the control unit preferably controls the measurement device to at least partially execute the measurement parallel to movement of the stage in the planar direction.

In the exposure apparatus, for example, the measurement device comprises a sensor for measuring a positional relationship between an imaging plane of the projection optical system and a surface of the substrate in the optical axis direction.

In the exposure apparatus, for example, the measurement device preferably comprises a sensor for measuring the tilt of the substrate in the optical axis direction.

In the exposure apparatus, for example, the measurement device preferably comprises a sensor for measuring a positional relationship between an imaging plane of the projection optical system and a surface of the substrate in the optical axis direction, and the tilt of the substrate in the optical axis direction.

In the exposure apparatus, for example, the control unit preferably adjusts the measurement start timing of the measurement device in accordance with a one-dimensional coordinate position of the area to be exposed on the substrate.

In the exposure apparatus, for example, the control unit preferably adjusts the measurement start timing of the measurement device in accordance with a two-dimensional coordinate position of the area to be exposed on the substrate.

In the exposure apparatus, for example, the control unit preferably adjusts the measurement start timing of the measurement device in accordance with a distance from a predetermined position on the substrate to the area to be exposed.

In the exposure apparatus, for example, the control unit preferably adjusts the measurement start timing of the measurement device in accordance with a range to which the area to be exposed belongs of the ranges defined by concentric ovals having a predetermined position of the substrate as a center.

According to another aspect of the present invention, a control method for an exposure apparatus which has a projection optical system, a stage which is movable in an optical axis direction of the projection optical system and a planar direction perpendicular to the optical axis direction, and a measurement device for measuring a positional relationship between a substrate placed on the stage and a predetermined position in the optical axis direction and/or a tilt of the substrate, sequentially moves and aligns the substrate to change an area to be exposed on the substrate, executes a measurement using the measurement device, and exposes while correcting the positional relationship between the substrate and the predetermined position in the optical axis direction and/or the tilt of the substrate in accordance with the measurement result, comprises: the control step of adjusting a measurement start timing of the measurement device in correspondence with a change in area to be exposed on the substrate.

Further objects, features and advantages of the present invention will become apparent from the following detailed description of embodiments of the present invention with reference to the accompanying drawings.

DETAILED DESCRIPTION OF THE PREFERRED EMBODIMENT

Figure 1:
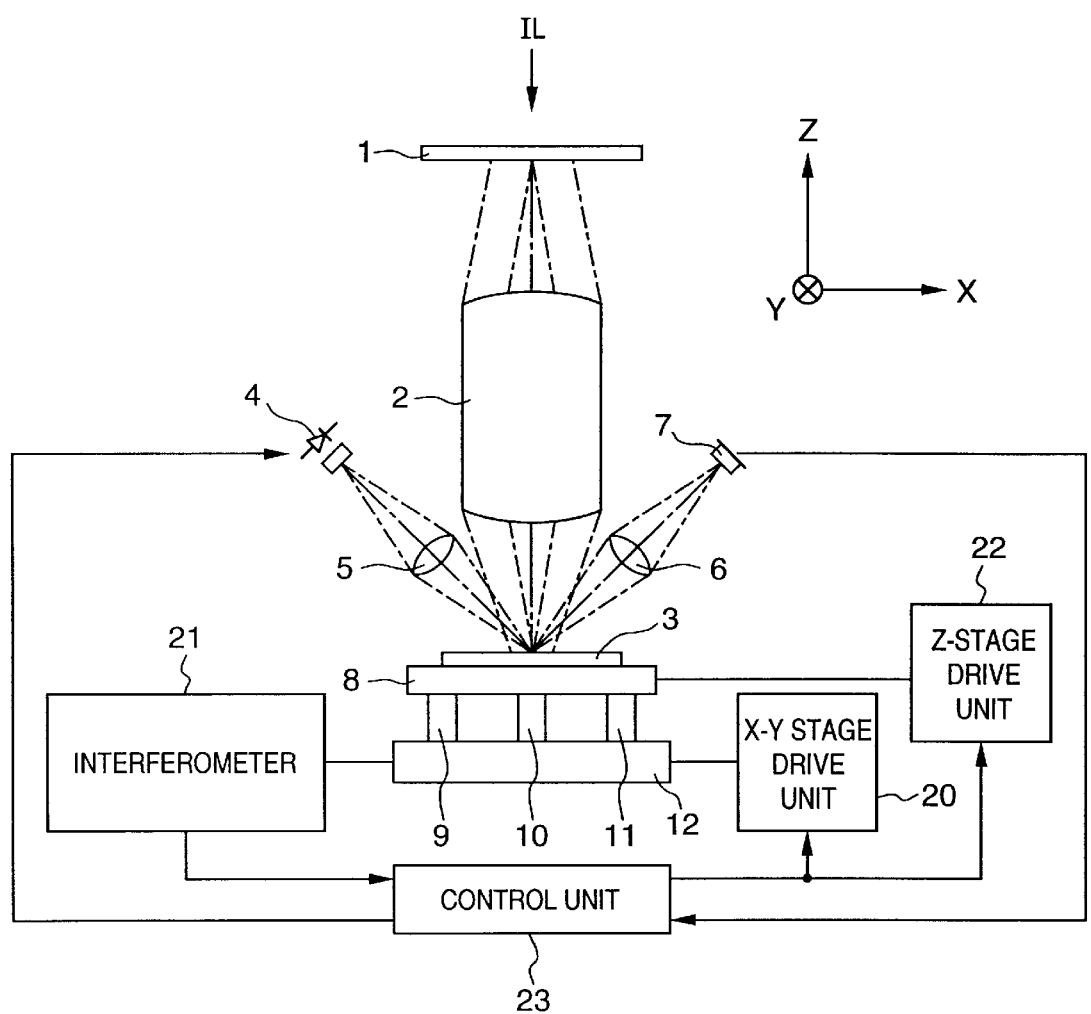
FIG. 1 is a schematic view showing the arrangement of a projection exposure apparatus which comprises a stage that can adjust focus and tilt errors by a measurement method of the present invention.

FIG. 1 shows the arrangement of a step-and-repeat projection exposure apparatus according to an embodiment of the present invention. In FIG. 1, a reticle 1 with a circuit pattern is illuminated by illumination light IL having uniform illuminance. The pattern on the reticle 1 is projected and imaged on a wafer 3 for the manufacture of a semiconductor device by a projection lens 2. The wafer 3 is placed on a Z-stage 8 that drives in the Z-and leveling-direction, and is driven by drive mechanisms 9, 10, and 11. These Z-stage and drive mechanisms 9, 10, and 11 are placed on an X-Y stage 12 which two-dimensionally translates in a horizontal plane (X-Y plane). The X-Y stage 12 is driven by an X-Y stage drive unit 20 including a motor and the like, and its coordinate position is measured by an interferometer 21. The Z-stage adjusts focus and tilt errors by independently moving the drive mechanisms 9, 10, and 11 in the vertical direction (the optical axis direction of the projection lens 2, i.e., in the Z-direction). The drive mechanisms 9, 10, and 11 vertically move in response to a drive amount instruction from a Z-stage drive unit 22.

A control unit 23 outputs a drive instruction to the X-Y stage drive unit 20 on the basis of the coordinate value measured by the interferometer 21, thereby aligning the X-Y stage 12 (i.e., the wafer 3) to an arbitrary position in the X-Y coordinate system.

In order to match the imaging plane of the projection lens 2 with a local shot area surface of the wafer 3, an oblique light incidence focus & tilt sensor is arranged. This sensor comprises a light source 4, a projection objective lens 5, a light-receiving objective lens 6 for receiving light reflected by the surface of the wafer 3, a light-receiving unit (CCD) 7, and the like. The control unit 3 calculates any focus and tilt errors of the local shot area surface of the wafer 3 on the basis of the measurement value of the oblique light incidence focus & tilt sensor, and outputs a instruction to the Z-stage drive unit 22.

Upon alignment from one shot area to another shot area on the wafer in the X-Y-Z coordinate system, the X-Y stage 12 (i.e., the wafer 3) is driven. The oblique light incidence focus & tilt sensor starts focus/tilt error measurements a wait time t after the beginning of driving of the X-Y stage 12. After that, the Z-stage 8 is driven based on the measurement value to correct the measured focus and tilt errors, thus completing alignment.

Figure 2:
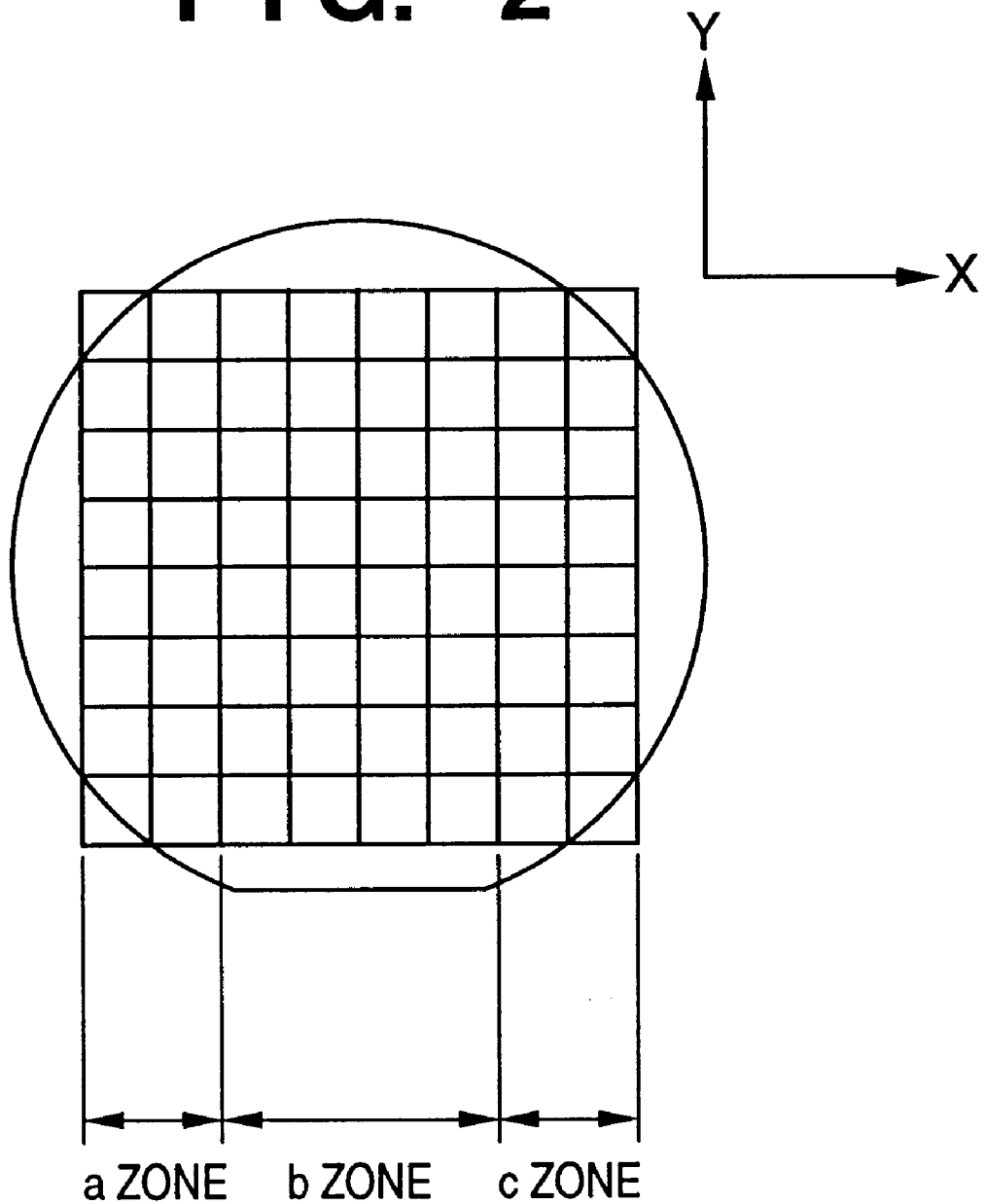
FIG. 2 is a schematic view showing an example of shot layout on a wafer.
Figure 3:
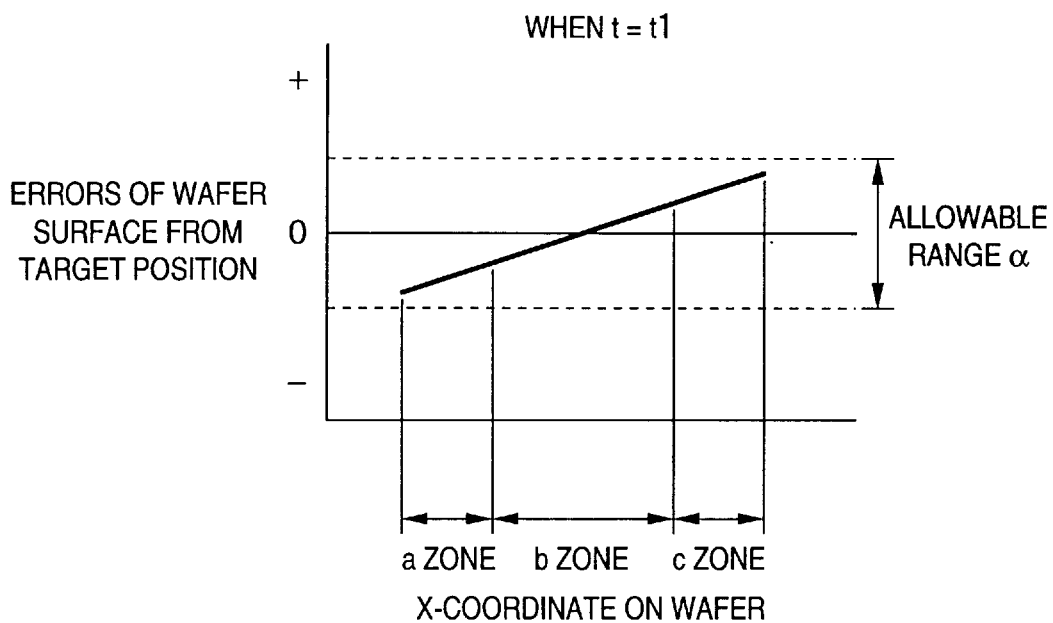
FIG. 3 is a graph for explaining errors from the target position that depend on the measurement start timing.
Figure 4:
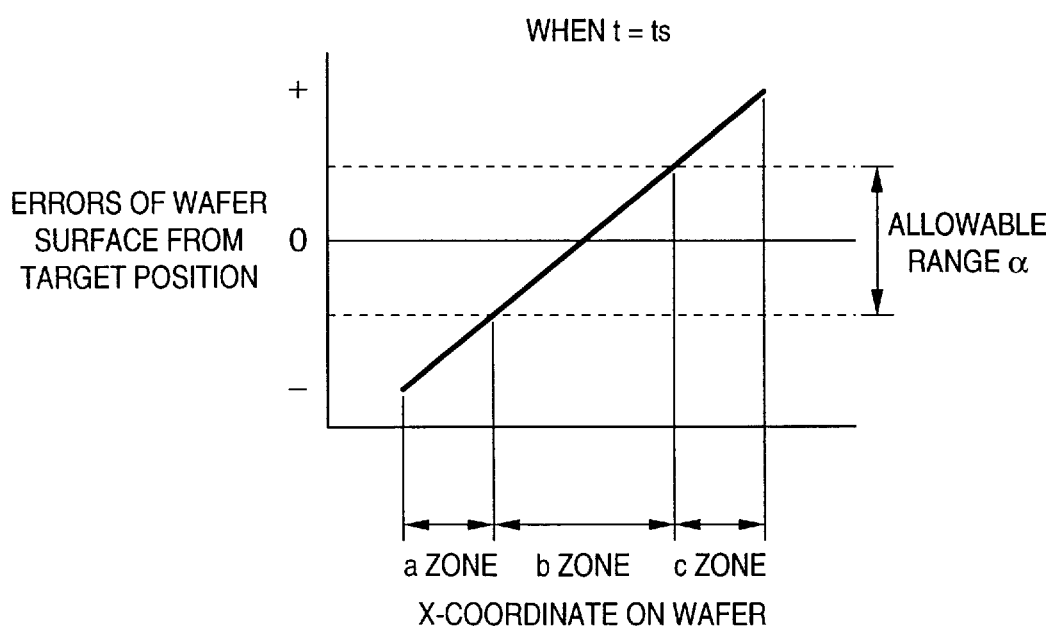
FIG. 4 is a graph for explaining errors from the target position that depend on the measurement start timing.

FIG. 2 shows an example of the shot layout used when the wafer region is divided into 64 shots. FIG. 3 exemplifies errors of the respective shot area surfaces from the target position (the imaging plane of the projection lens) after the measured focus and tilt errors are corrected, when the wait time t is set at a given value t1 [sec] for all the shots in the shot layout shown in FIG. 2. Note that FIG. 3 shows errors of eight shots having an identical X-coordinate value from the target position (the same applies to FIGS. 4 and 5). FIG. 4 exemplifies errors from the target position when the time t is set at a certain value ts [sec] (<t1) for all the shots. FIG. 3 shows an example wherein the errors from the target position fall within an allowable range α on the entire wafer region, and FIG. 4 shows a case wherein the errors in zones a and c in the wafer region fall outside the allowable range α. More specifically, when the wait time t is set at ts [sec] for all the shots to shorten the alignment time, the adjustment precision of focus and tilt errors worsens. In the prior art, since an identical wait time t can only be set for all the positions in the wafer plane, t1 [sec] at which all the shots satisfy the allowable value must be selected.

By contrast, in this embodiment, the wait time t is set at ts [sec] for 32 shots in zone b with high precision (within the allowable range α), and is set at t1 [sec] for another 32 shots in zones a and c with poor precision. In this manner, as compared to t1 [sec] set for all the shots, the alignment time per wafer can be shortened by:

(t1−ts)×32 shots [sec]

Figure 5:
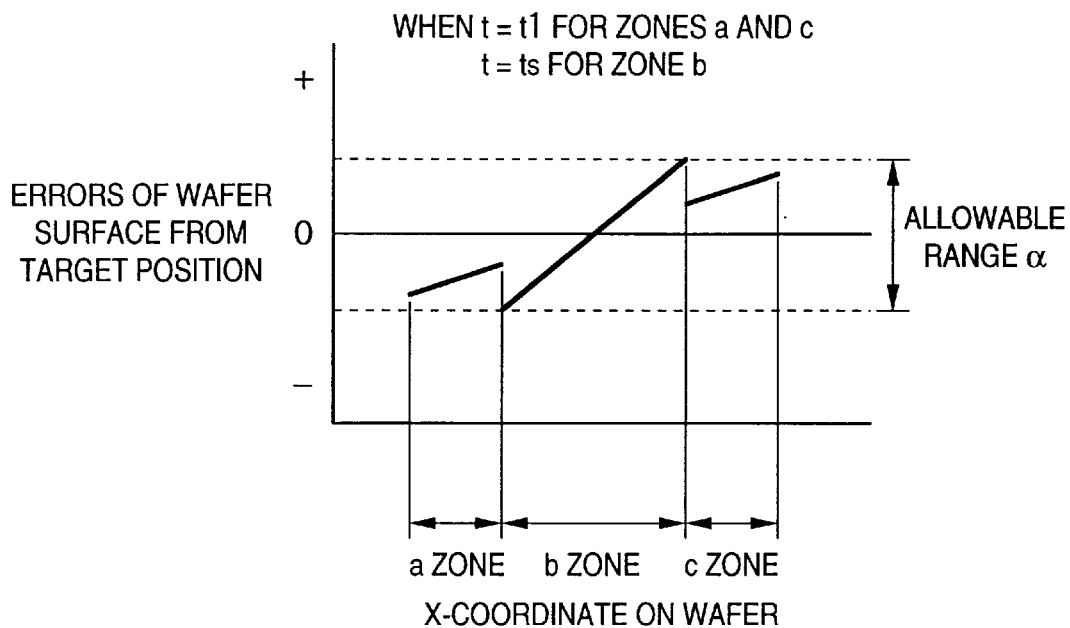
FIG. 5 is a graph for explaining errors from the target position that depend on the measurement start timing.
Figure 6:
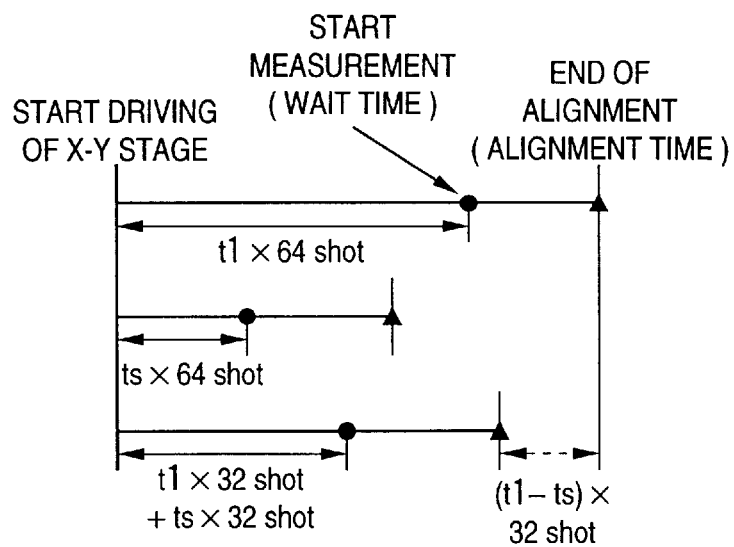
FIG. 6 is a chart for explaining alignment times that depend on the measurement start timing.

FIG. 6 schematically shows the operation of this embodiment. FIG. 5 shows errors of the wafer surface from the target position during this operation. According to this embodiment, errors fall within the allowable range α in all zones a, b, and c.

The above embodiment has exemplified a case wherein errors of the wafer surface from the target position and X-coordinates on the wafer have a linear relationship, as shown in FIGS. 3 and 4. However, the present invention can be similarly applied with reference to the allowable range a even when they have a nonlinear relationship.

In the above embodiment, the wafer region is divided into three zones a, b, and c according to a one-dimensional coordinate (X). However, the present invention is not limited to the coordinate system shown in FIG. 2. For example, an arbitrary two-dimensional coordinate system, e.g., X-Y coordinate system, may be used, the wafer region may be divided into two or more areas, and arbitrary wait times t can be set for these divided areas.

Also, for example, the wafer region may be divided into two or more areas in accordance with the distances from a predetermined position (e.g., the center) of the wafer (stage), and arbitrary wait times t can be set for these divided areas.

Furthermore, for example, concentric ovals having a predetermined position of the wafer (stage) as the center may be defined, the wafer region may be divided into areas each sandwiched between two adjacent concentric ovals, and arbitrary wait times t can be set for these divided areas.

Moreover, the above embodiment has exemplified a case wherein focus and tilt errors are measured in units of shots on the substrate to be exposed such as a semiconductor wafer or the like while stepping the substrate to be exposed, and these errors are corrected based on the measurement values to attain exposure. Also, the present invention can be applied to a case wherein a master disk such as a mask or the like is moved and aligned in a direction perpendicular to the optical axis direction (Z-direction) of the projection optical system, and also in the optical axis direction, and alignment and tilt errors of the master disk are corrected. This is particularly suitable for an apparatus which exposes while moving and aligning each of a plurality of exposure patterns formed on the master disk in the direction perpendicular to the optical axis direction of the projection optical system, and aligning it also in the optical axis direction.

An embodiment of the method of manufacturing a device using the above-mentioned projection exposure apparatus or method will be explained below.

Figure 7:
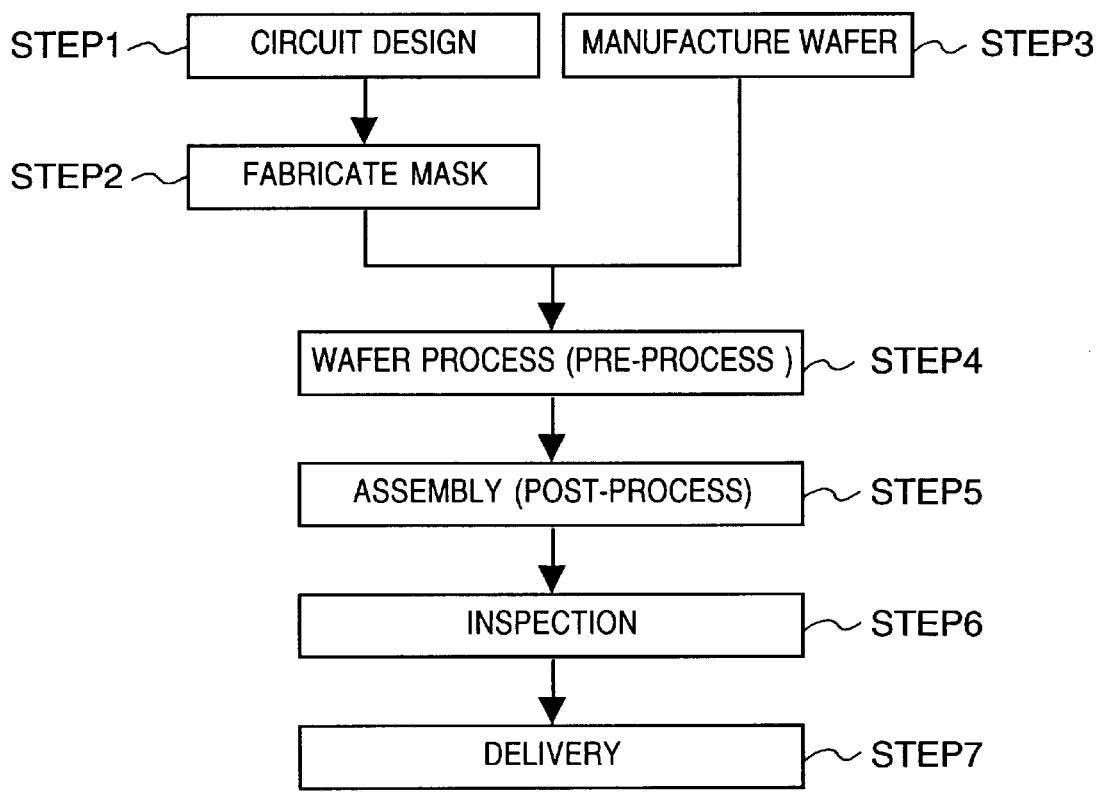
FIG. 7 is a flow chart showing the flow in the manufacture of a microdevice.

FIG. 7 shows the flow in the manufacture of a microdevice (semiconductor chips such as ICs, LSIs, and the like, liquid crystal panels, CCDs, thin film magnetic heads, micromachines, and so forth). In step 1 (circuit design), the circuit design of a semiconductor device is made. In step 2 (manufacture mask), a mask formed with a designed circuit pattern is manufactured. In step 3 (fabricate wafer), a wafer is fabricated using materials such as silicon and the like. Step 4 (wafer process) is called a pre-process, and an actual circuit is formed by lithography using the prepared mask and wafer. The next step 5 (assembly) is called a post-process, in which semiconductor chips are assembled using the wafer obtained in step 4, and includes an assembly process (dicing, bonding), a packaging (encapsulating chips), and the like. In step 6 (inspection), inspections such as operation confirmation tests, durability tests, and the like of semiconductor devices assembled in step 5 are run. Semiconductor devices are completed via these processes, and are delivered (step 7).

Figure 8:
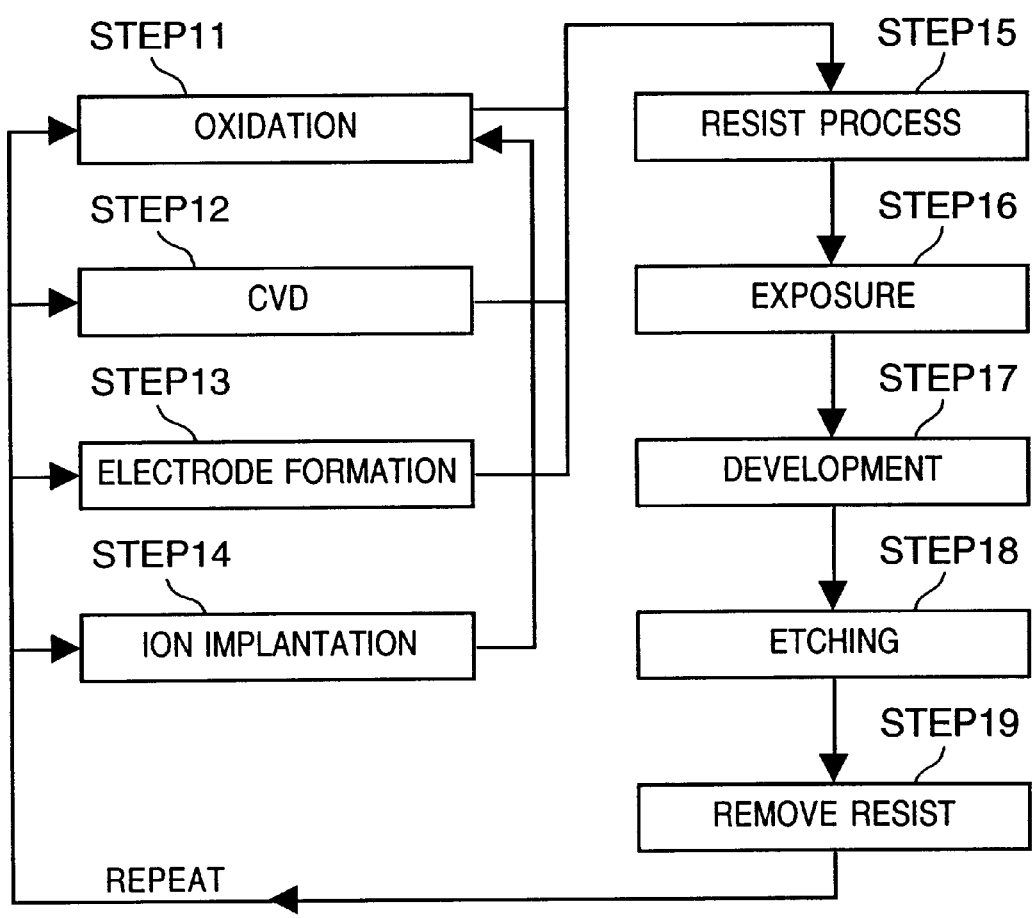
FIG. 8 is a flow chart showing the detailed flow of a wafer process shown in FIG. 7.

FIG. 8 shows the detailed flow of the wafer process. In step 11 (oxidation), the surface of the wafer is oxidized. In step 12 (CVD), an insulating film is formed on the wafer surface. In step 13 (electrode formation), electrodes are formed by deposition on the wafer. In step 14 (ion implantation), ions are implanted into the wafer. In step 15 (resist process), a photosensitive agent is applied on the wafer. In step 16 (exposure), the circuit pattern on the mask is printed on the wafer by exposure using the electron beam exposure apparatus. In step 17 (development), the exposed wafer is developed. In step 18 (etching), a portion other than the developed resist image is removed by etching. In step 19 (remove resist), the resist film which has become unnecessary after the etching is removed. By repeating these steps, multiple circuit patterns are formed on the wafer. In this embodiment, in the repetitive processes, accurate alignment can be attained without being influenced by processes by optimally setting the acceleration voltage of an alignment electron beam, as described above.

According to the manufacturing method of this embodiment, a highly integrated semiconductor device which is not easy to manufacture by the conventional method can be manufactured at low cost.

As described above, according to the present invention, the measurement start timing of focus and tilt errors of the substrate surface on the stage can be arbitrarily changed in correspondence with different positions on the substrate on the stage. Hence, focus and tilt error measurements can be started at timings optimal for different positions on the substrate on the stage, and the substrate surface can be accurately matched with the imaging plane of the projection optical system without lowering the measurement precision of focus and tilt errors. As a result, productivity can be improved.

The present invention is not limited to the above embodiments and various changes and modifications can be made within the spirit and scope of the present invention. Therefore, to apprise the public of the scope of the present invention the following claims are made.

What is claimed is:

1. An exposure apparatus which has a projection optical system, a stage which is movable in an optical axis direction of said projection optical system and a planar direction perpendicular to the optical axis direction, and a measurement device for measuring a positional relationship between a substrate placed on said stage and a predetermined position in the optical axis direction and/or a tilt of the substrate, sequentially moves and aligns the substrate to change an area to be exposed on the substrate, executes a measurement using said measurement device, and exposes while correcting the positional relationship between the substrate and the predetermined position in the optical axis direction and/or the tilt of the substrate in accordance with the measurement result, comprising:

a control unit for adjusting a measurement start timing of said measurement device in correspondence with a change in area to be exposed on the substrate.

2. The apparatus according to claim 1, wherein said control unit controls said measurement device to at least partially execute the measurement parallel to movement of said stage in the planar direction.

3. The apparatus according to claim 1, wherein said measurement device comprises a sensor for measuring a positional relationship between an imaging plane of the projection optical system and a surface of the substrate in the optical axis direction.

4. The apparatus according to claim 1, wherein said measurement device comprises a sensor for measuring the tilt of the substrate in the optical axis direction.

5. The apparatus according to claim 1, wherein said measurement device comprises a sensor for measuring a positional relationship between an imaging plane of the projection optical system and a surface of the substrate in the optical axis direction, and the tilt of the substrate in the optical axis direction.

6. The apparatus according to claim 1, wherein said control unit adjusts the measurement start timing of said measurement device in accordance with a one-dimensional coordinate position of the area to be exposed on the substrate.

7. The apparatus according to claim 1, wherein said control unit adjusts the measurement start timing of said measurement device in accordance with a two-dimensional coordinate position of the area to be exposed on the substrate.

8. The apparatus according to claim 1, wherein said control unit adjusts the measurement start timing of said measurement device in accordance with a distance from a predetermined position on the substrate to the area to be exposed.

9. The apparatus according to claim 1, wherein said control unit adjusts the measurement start timing of said measurement device in accordance with a range to which the area to be exposed belongs of the ranges defined by concentric ovals having a predetermined position of the substrate as a center.

10. The apparatus according to claim 1, wherein the substrate is a substrate for the manufacture of a semiconductor device.

11. A control method for an exposure apparatus which has a projection optical system, a stage which is movable in an optical axis direction of said projection optical system and a planar direction perpendicular to the optical axis direction, and a measurement device for measuring a positional relationship between a substrate placed on said stage and a predetermined position in the optical axis direction and/or a tilt of the substrate, sequentially moves and aligns the substrate to change an area to be exposed on the substrate, executes a measurement using said measurement device, and exposes while correcting the positional relationship between the substrate and the predetermined position in the optical axis direction and/or the tilt of the substrate in accordance with the measurement result, comprising:

the control step of adjusting a measurement start timing of said measurement device in correspondence with a change in area to be exposed on the substrate.

12. The method according to claim 11, wherein the control step includes the step of controlling said measurement device to at least partially execute the measurement parallel to movement of said stage in the planar direction.

13. The method according to claim 11, wherein said measurement device comprises a sensor for measuring a positional relationship between an imaging plane of the projection optical system and a surface of the substrate in the optical axis direction.

14. The method according to claim 11, wherein said measurement device comprises a sensor for measuring the tilt of the substrate in the optical axis direction.

15. The method according to claim 11, wherein said measurement device comprises a sensor for measuring a positional relationship between an imaging plane of the projection optical system and a surface of the substrate in the optical axis direction, and the tilt of the substrate in the optical axis direction.

16. The method according to claim 11, wherein the control step includes the step of adjusting the measurement start timing of said measurement device in accordance with a one-dimensional coordinate position of the area to be exposed on the substrate.

17. The method according to claim 11, wherein the control step includes the step of adjusting the measurement start timing of said measurement device in accordance with a two-dimensional coordinate position of the area to be exposed on the substrate.

18. The method according to claim 11, wherein the control step includes the step of adjusting the measurement start timing of said measurement device in accordance with a distance from a predetermined position on the substrate to the area to be exposed.

19. The method according to claim 11, wherein the control step includes the step of adjusting the measurement start timing of said measurement device in accordance with a range to which the area to be exposed belongs of the ranges defined by concentric ovals having a predetermined position of the substrate as a center.

20. The method according to claim 11, wherein the substrate is a substrate for the manufacture of a semiconductor device.

21. A semiconductor device manufactured using an exposure apparatus of claim 1.

22. A semiconductor device manufactured using an exposure apparatus controlled by a control method of claim 11.

* * * * *